US 6,687,269 B1

United States Patent
Rice et al.

(12) United States Patent
Rice et al.

(10) Patent No.: US 6,687,269 B1
(45) Date of Patent: Feb. 3, 2004

(54) SPREAD SPECTRUM DITHER FOR LOCKING TO TRANSMISSION PEAK IN TUNABLE LASER

(75) Inventors: Mark S. Rice, San Jose, CA (US); Andrew J. Daiber, Emerald Hills, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/335,630

(22) Filed: Dec. 31, 2002

(51) Int. Cl.[7] ................................................ H01S 3/13

(52) U.S. Cl. ........................ 372/29.022; 372/29.023; 372/32; 372/29.02; 372/28

(58) Field of Search ....................... 372/29.022, 29.023, 372/32, 29.02, 26, 28

(56) References Cited

U.S. PATENT DOCUMENTS

| | | | |
|---|---|---|---|
| 5,798,859 A | * 8/1998 | Colbourne et al. | 359/247 |
| 6,108,355 A | * 8/2000 | Zorabedian | 372/20 |
| 6,526,071 B1 | * 2/2003 | Zorabedian et al. | 372/20 |
| 2002/0126345 A1 | * 9/2002 | Green et al. | 359/122 |

\* cited by examiner

*Primary Examiner*—Leon Scott, Jr.
(74) *Attorney, Agent, or Firm*—Blakely, Sokoloff, Taylor & Zafman LLP

(57) ABSTRACT

An apparatus including a cavity optical length actuator to vary a cavity optical path length of a laser in response to an excitation signal having varying frequencies. The cavity optical length actuator induces intensity perturbations in an optical beam of the laser corresponding to the excitation signal. A sensor senses the intensity perturbations in the optical beam and generates a response signal corresponding to the intensity perturbations. A combiner combines the excitation signal and the response signal to generate an error signal.

32 Claims, 8 Drawing Sheets

100

SPREAD SPECTRUM DITHER FOR LOCKING TO TRANSMISSION PEAK IN TUNABLE LASER

TECHNICAL FIELD

This disclosure relates generally to optical communications, and in particular but not exclusively, relates to a dither technique for locking to a transmission peak in tunable lasers.

BACKGROUND INFORMATION

Tunable external cavity lasers (ECLs) are widely used in lightwave test-and-measurement equipment and are becoming recognized as essential components for the rapidly expanding field of wavelength division multiplexed ("WDM") optical communication. Tunable ECLs have been developed to provide external cavity tuning of the central lasing wavelength. This external cavity tuning has been achieved using various mechanisms such as mechanically tuned optical gratings used in transmission and reflection. Tunable ECLs must be capable of providing a stable, single mode output at selectable wavelengths while effectively suppress lasing associated with external cavity modes that are within the gain bandwidth of the cavity.

In dense wavelength division multiplexing (DWDM) fiber optic systems, multiple separate data streams propagate concurrently in a single optical fiber, with each data stream created by the modulated output of an ECL at a specific channel wavelength. Presently, channel separations of approximately 0.4 nanometers in wavelength or about 50 GHz are achievable, which allows up to 128 channels to be carried by a single fiber within the bandwidth range of currently available fibers and ECLs. Greater bandwidth requirements will likely result in smaller channel separation in the future. Thus, accurate control over the central lasing wavelength of the ECL is currently desirable and of increasing importance as channel separations decrease.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION

Embodiments of a system and method for a spread spectrum dither for locking to a transmission peak in a tunable external cavity diode laser (ECDL) are described herein. In the following description numerous specific details are set forth to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
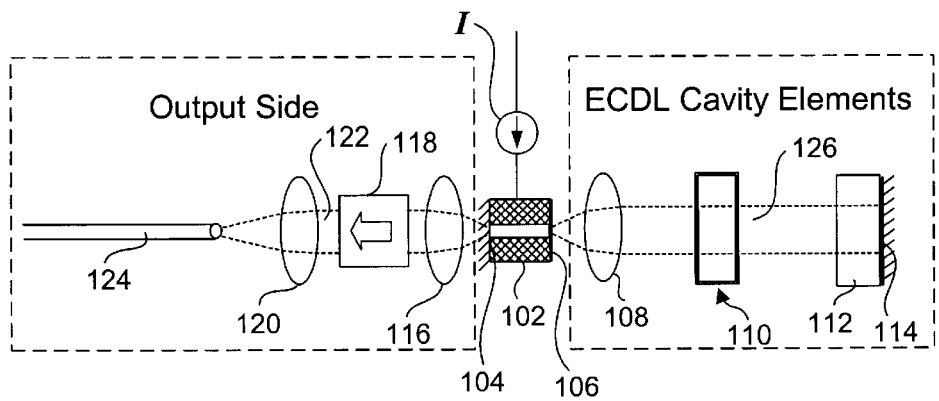
FIG. 1 illustrates an embodiment of an external cavity diode laser (ECDL) for use with embodiments of the dither technique for locking to a transmission peak in accordance with the teachings of the present invention.

As an overview, a generalized embodiment of an ECDL 100 that may be used to implement aspects of the invention described below is shown in FIG. 1. ECDL 100 includes a gain medium having a diode gain chip 102. Diode gain chip 102 includes a Fabry-Perot diode laser having a partially-reflective front facet 104 and a non-reflective rear facet 106 coated with an anti-reflective (AR) coating to reduce reflections at its face. In one embodiment, diode gain chip 102 may include a bent-waveguide structure on the gain medium to realize non-reflective rear-facet 106. The external cavity elements include a diode intracavity collimating lens 108, tuning filter elements 110, a cavity-length modulating element 112, and a reflective element 114. In general, reflective element 114 may comprise a mirror, grating, prism, retro-reflector, or the like. The output side components include a diode output collimating lens 116, an optical isolator 118, and a fiber focusing lens 120, which focuses an output optical beam 122 such that it is launched into a fiber 124.

The basic operation of ECDL 100 is a follows. A controllable current I is supplied to diode gain chip 102 (the gain medium), resulting in a voltage differential across the diode junction, which produces an emission of optical energy (photons). The emitted photons pass back and forth between partially-reflective front facet 104 and reflective element 114, which collectively define the extremities of an external laser cavity. As the photons pass back and forth, a plurality of resonances, or "lasing" modes are produced. Under a lasing mode, a portion of the optical energy (photons) temporarily occupies the external laser cavity, as depicted by intracavity optical beam 126; at the same time, a portion of the photons in the external laser cavity eventually passes through partially-reflective front facet 104, thereby producing the laser's output optical beam 122. Through appropriate modulation of the input current (generally for communication rates of up to 2.5 GHz) or through modulation of an external element disposed in the path of output optical beam 122 (not shown) (for 10 GHz and 40 GHz communication rates), data can be modulated on output optical beam 122 to produce an optical data signal. Such a signal may be transmitted over a fiber-based network in accordance with practices well-known in the optical communication arts, thereby providing very high bandwidth communication capabilities.

Photons that exit the laser cavity through partially-reflective front facet 104 pass through diode output collimating lens 116, which collimates the photons into output optical beam 122. Output beam 122 then passes through optical isolator 118. Optical isolator 118 is employed to prevent back-reflected light from being passed back into the external laser cavity, and is generally an optional element. After the light beam passes through optical isolator 118, it is launched into fiber 124 by fiber focusing lens 120. Fiber 124 may be either a polarization-preserving type or a single-mode type such as SMF-28.

In one embodiment, the lasing mode of ECDL 100 is a function of the total optical path length between the cavity extremities (the cavity optical path length); that is, the optical path length encountered as the light passes through the various optical elements and spaces between the cavity extremities defined by partially-reflective front facet 104 and reflective element 114. This includes diode gain chip 102, diode intracavity collimating lens 108, tuning filter elements 110, and cavity-length modulating element 112, plus the path lengths between the optical elements (i.e., the path length of the transmission medium occupying the cavity of ECDL 100, which is typically a gas such as air). More precisely, the total optical path length is the sum of the path lengths through each optical element and the transmission medium times the index of refraction for that element or medium.

As discussed above, under a lasing mode, photons pass back and forth between the cavity extremities at a resonance frequency, which is a function of the cavity optical path length (variable) and the speed of light (a constant). In fact, without tuning filter elements 110, ECDL 100 would resonate at multiple frequencies. For simplicity, if we model the external laser as a simple Fabry-Perot cavity, these frequencies can be determined from the following equation.

$$Cl = \frac{\lambda x}{2n} \quad (1)$$

where λ=wavelength, Cl=Length of the cavity, x=an arbitrary integer-1, 2, 3, . . . , and n=refractive index of the medium. The number of resonant frequencies is determined from the width of the gain spectrum. Furthermore, the gain spectrum is generally shaped as an inverted parabola having a central peak—thus, the intensity of the lasing modes on the sides of the center wavelength (commonly called the side modes) rapidly drops off.

As described below in further detail, various techniques may be applied to "tune" embodiments of ECDL 100 to produce a lasing frequency corresponding to a desired communication channel. For example, this may be accomplished by adjusting one or more tuning elements, such as tuning filter elements 110, to produce a corresponding change in the cavity optical path length, thus changing the lasing mode frequency. Tuning filter elements 110 attenuate the unwanted lasing modes such that output optical beam 122 is substantially coherent light having a narrow line width.

Ideally, it is desired to maximize the power of output optical beam 122 over a frequency range corresponding to the various channel frequencies for which embodiments of ECDL 100 are designed. While one solution might be to simply provide more drive current, this, by itself, does not work because a change in the drive current changes the optical characteristics (e.g., optical path length) of diode gain chip 102. Furthermore, many diode gain chips only operate over a limited range of input current.

One technique for producing a maximal power output is to perform "wavelength-locking" through phase control modulation. Under this technique, a "dither" or modulation signal is supplied to cause a corresponding modulation in the cavity optical path length of ECDL 100. This produces a modulated phase-shift effect, resulting in a small frequency dither of the lasing mode. The result of this frequency dither produces a corresponding intensity perturbation in output optical beam 122, also referred to as amplitude modulation. This intensity perturbation can be detected using various techniques. In one embodiment, the laser diode junction voltage (the voltage differential across laser diode chip 102) is monitored while supplying a constant current, wherein the voltage is indicative of the intensity of output optical beam 122, e.g., a maximum measured voltage corresponds to a maximum beam intensity. In another embodiment, a beam splitter is employed to split off a portion of the output beam such that the intensity of the split-off portion can be measured by a photo-electric device, such as a photodiode. The intensity measured by the photodiode is proportional to the intensity of output optical beam 122. The measured intensity perturbation may then be used to generate an error signal that is fed back into a servo control loop to adjust the cavity optical path length substantially continuous so as to produce maximal intensity.

Figure 2:
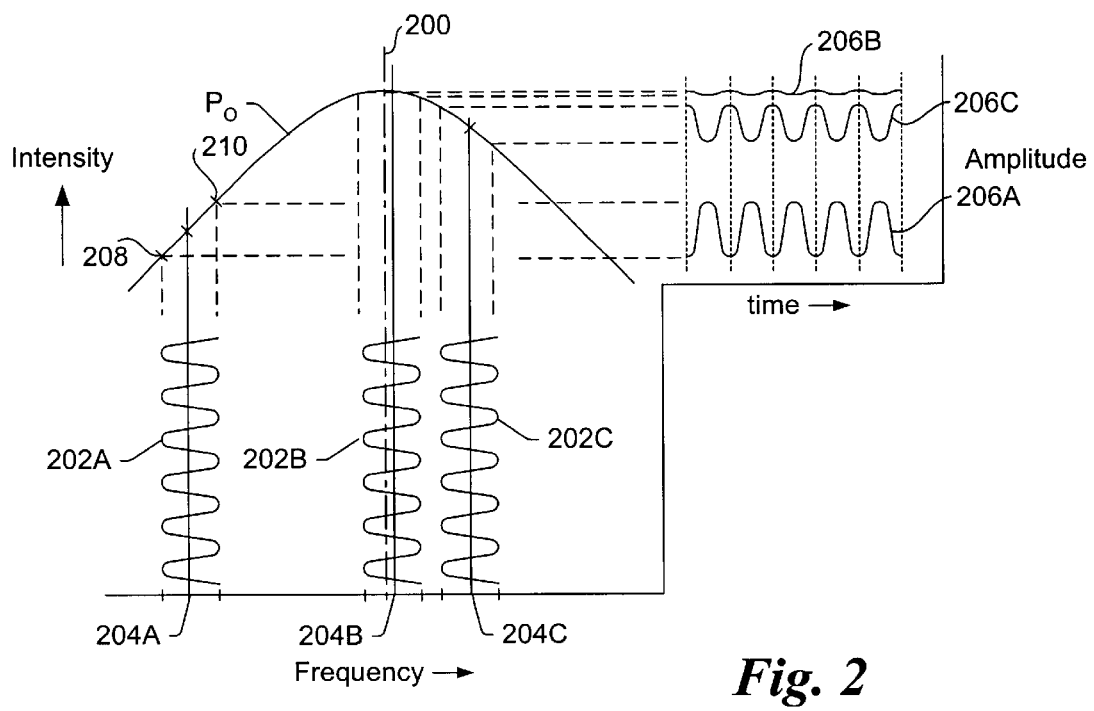
FIG. 2 illustrates a relationship between a dither excitation signal and a detected modulated response signal output beam in accordance with the teachings of the present invention.

The foregoing scheme is schematically illustrated in FIG. 2. FIG. 2 shows an embodiment of a power output curve $P_O$ that is illustrative of a typical power output curve of embodiments of ECDL 100 that results when the lasing mode is close to a desired channel frequency, which is indicated by a channel frequency centerline 200. The objective of a servo loop that employs the phase-shift modulation scheme is to adjust one or more optical elements in the laser cavity of ECDL 100 such that the lasing frequency is shifted toward the desired channel frequency. This is achieved through use of a demodulated error signal that results from frequency modulation of the lasing mode. Under the technique, a dither excitation signal is supplied to an optical element in the cavity, such as cavity optical length modulating element 112, to modulate the cavity optical path length, and thereby modulate the lasing frequency. This modulation of the lasing frequency is relatively low frequency compared to the channel spacing for embodiments of ECDL 100. For example, in one embodiment the lasing frequency modulation may cause a frequency excursion of 4 MHz, while the channel spacing is 50 GHz.

Dither excitation signals 202A, 202B, and 202C correspond to lasing frequencies 204A, 204B, and 204C, respectively. Lasing frequency 204A is less than channel frequency centerline 200, lasing frequency 204C is higher than channel frequency centerline 200, while lasing frequency 204B is near the desired channel frequency centerline 200. Each dither excitation signal 202A, 202B, and 202C produces a modulation in the intensity of output optical beam 122; these intensity modulations are respectively shown as modulated response signals 206A, 206B, and 206C. Generally, these latter signals can be measured in the manners discussed above for determining the intensity of output optical beam 122.

As depicted in FIG. 2, the peak to valley amplitude of modulated response signals 206A, 206B, and 206C is directly tied to the upper and lower intensity points at which their corresponding dither excitation signals 202A, 202B, and 202C intersect with power output curve $P_O$, such as depicted by intersection points 208 and 210 for dither excitation signal 202A. Thus, as the lasing frequency gets closer to channel frequency centerline 200, the peak to valley amplitude of the measured intensity of output optical beam 122 decreases. At the point where the lasing frequency and channel frequency centerline 200 coincide, this value becomes a minimum.

Figure 3:
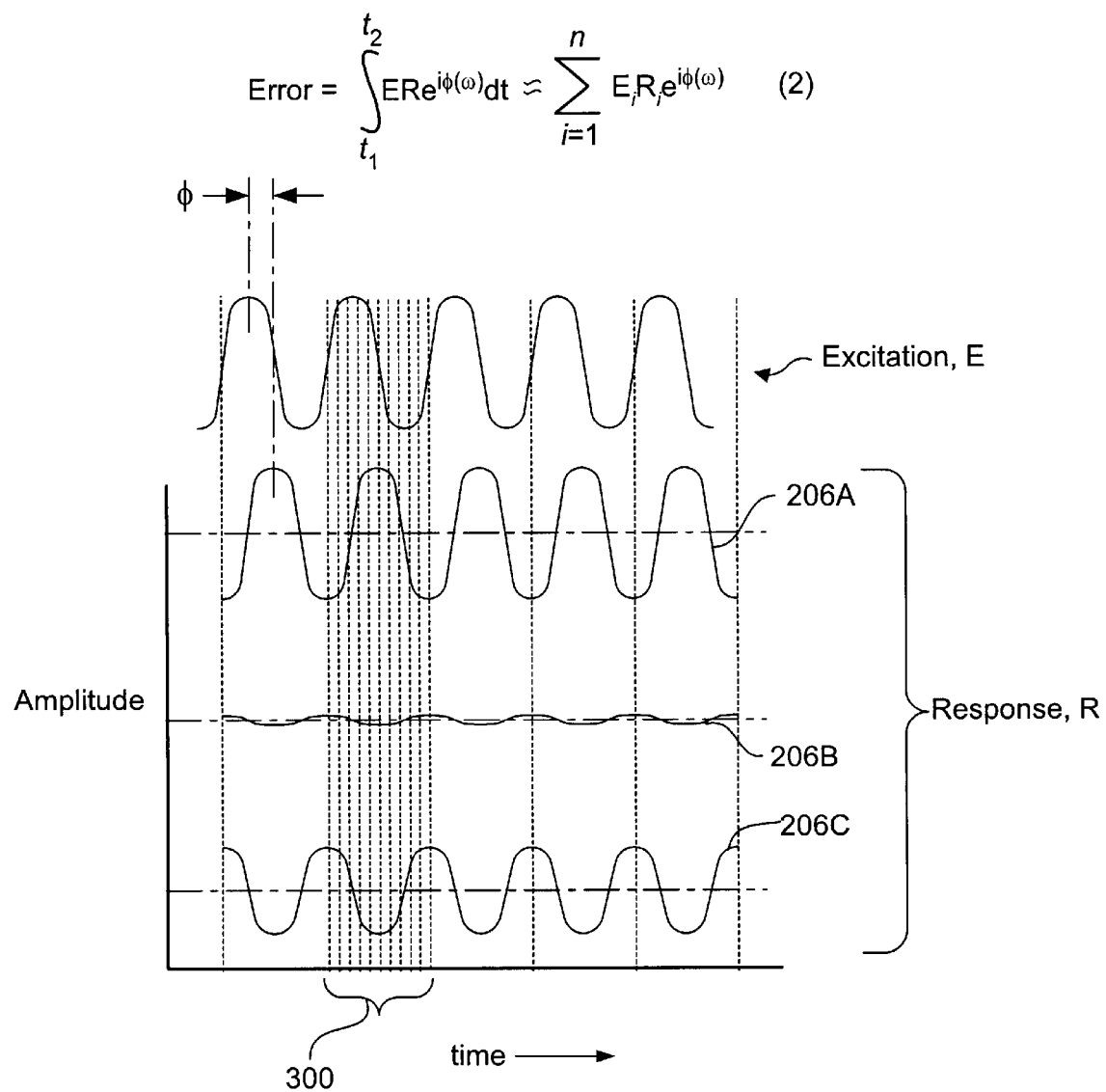
FIG. 3 illustrates a phase difference between an input dither excitation signal and a detected modulated response signal in accordance with the teachings of the present invention.

Furthermore, as shown in FIG. 3, the error may be derived from:

$$\text{Error} = \int_{t_1}^{t_2} ERe^{i\phi(\omega)} dt \approx \sum_{i=1}^{n} E_i R_j e^{i\phi(\omega)} \quad (2)$$

wherein E represents the amplitude of the dither excitation signal (e.g., dither excitation signals 202A, 202B, and 202C), R represents the amplitude of the modulated response signal (e.g., modulated response signals 206A, 206B, and 206C), the non-italicized i is an imaginary number, $\phi$ represents the phase difference between the dither excitation signal and the modulated response signal, and $\omega$ is the frequency of the dither excitation signal. The integral solution can be accurately approximated by a discreet time sampling scheme typical of digital servo loops of the type described below, as depicted by time sample marks 300.

In addition to providing an error amplitude, the foregoing scheme also provides an error direction. For example, when the lasing frequency is in error on one side of channel frequency centerline 200 (lower in the illustrated example), the dither excitation signals and the modulated response signals will be substantially in phase. This will produce a positive aggregated error value. In contrast, when the lasing frequency is on the other side of channel frequency centerline 200 (higher in the example), the dither excitation signals and the modulated response signals are substantially out of phase. As a result, the aggregated error value will be negative.

Generally, X should be selected to be several orders of magnitude below the lasing frequency. For example, dither excitation signal frequencies within the range of 100 Hz–100 kHz may be used in one embodiment having a lasing frequency of 185–199 THz.

Figure 4:
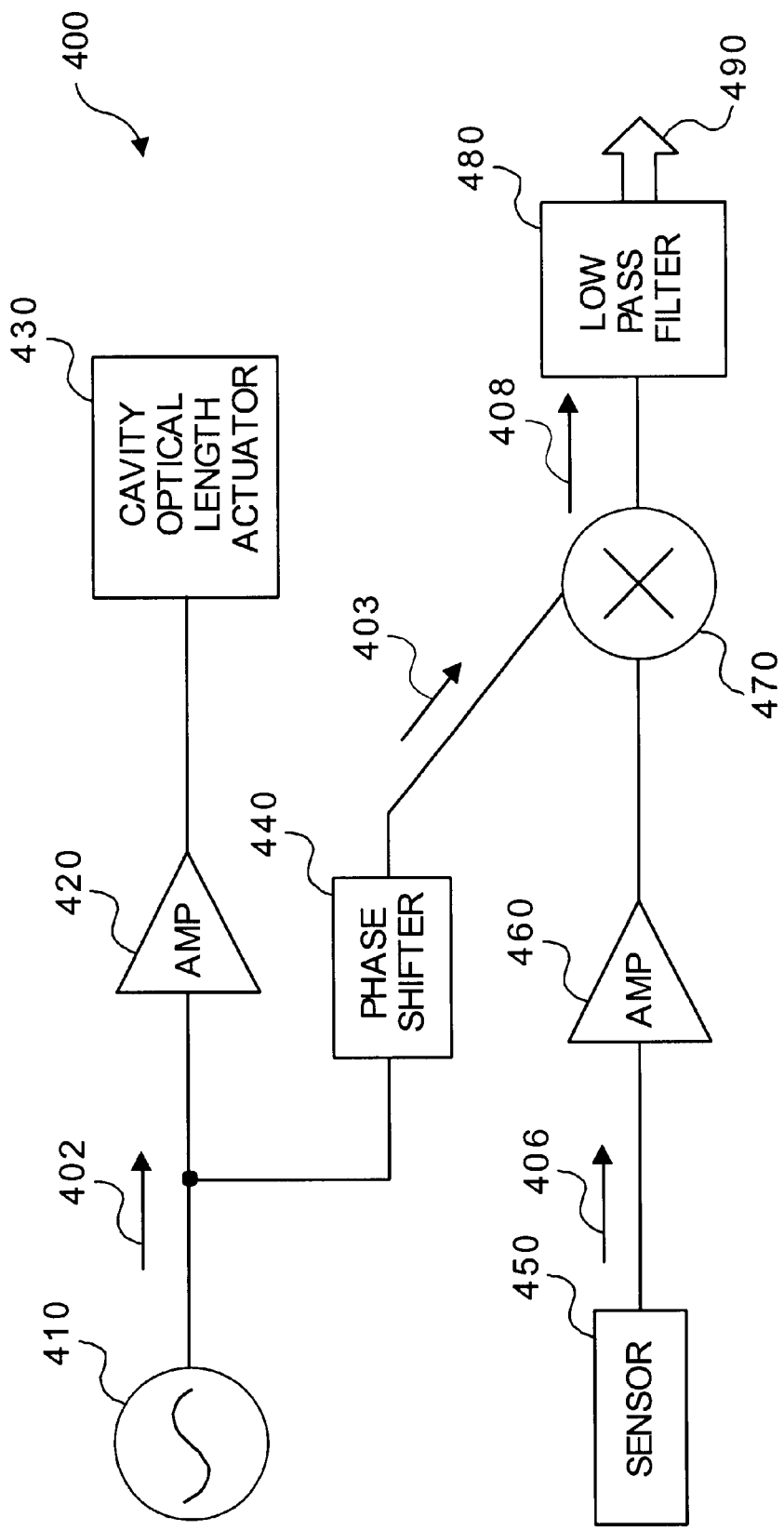
FIG. 4 illustrates an embodiment of a sinusoidal dither control loop in accordance with teachings of the present invention.

FIG. 4 illustrates an embodiment of a sinusoidal dither control loop 400 for implementing the wavelength-locking mechanism described in connection with FIGS. 2 and 3. In this embodiment, sinusoidal dither control loop 400 includes a sinusoidal signal generator 410, an amplifier 420, a cavity optical length actuator 430, a phase shifter 440, a sensor 450, an amplifier 460, a multiplier 470, and a low pass filter 480.

Sinusoidal signal generator 410 generates a dither excitation signal 402 (e.g., dither excitation signals 202A, 202B, and 202C discussed above). Dither excitation signal 402 is received by amplifier 420 and amplified for driving cavity optical length actuator 430. Cavity optical length actuator 430 changes the lasing frequency, which induces a corresponding intensity perturbation in output optical beam 122. Sensor 450 senses the intensity perturbation and outputs a corresponding modulated response signals 406 (e.g., 206A, 206B, and 206C discussed above). Modulated response signal 406 is then amplified by amplifier 460 and passed to multiplier 470. Dither excitation signal 402 is further received by phase shifter 440, which shifts dither excitation signal 402 in phase (i.e., delay in time) to generate a phase shifted signal 403. Phase shifted signal 403 is then passed to multiplier 470. Multiplier 470 generates an unfiltered error signal 408 by taking the dot product of its inputs—phase shifted signal 403 and modulated response signal 406. Unfiltered error signal 408 is then filtered by low pass filter 480 to produce an error signal 490. Error signal 490 is used as a feedback signal to finely adjust the lasing frequency of ECDL 100 such that it is maintained at the transmission peak of power output curve $P_O$ (i.e., channel frequency centerline 200). This is referred to as "wavelength-locking."

In one embodiment, sensor 450 is a photodetector (e.g., photodetector 626 discussed below) that senses the intensity perturbations of output optical beam 122. These intensity perturbations correspond to modulated response signal 406. In an alternative embodiment, sensor 450 senses a junction voltage $V_J$ across diode gain chip 102, which is indicative of the intensity perturbations of output optical beam 122.

Modulated response signal 406 is generated by cavity optical length actuator 430 in response to dither excitation signal 402. However, modulated response signal 406 is time delayed compared to dither excitation signal 402, as depicted by phase delay angle $\phi$ in FIG. 3. This time delay, which corresponds to a phase shift, is a result of the phase shifts introduced by various control loop elements, including: amplifier 420, cavity optical length actuator 430, sensor 450, and amplifier 460.

By eliminating this phase shift, the $e^{i\phi(\omega)}$ term in Equation (2) can be set to 1. Accordingly, the resulting equation simply becomes a summation of time-sampled dot products of dither excitation signal 402 and modulated response signal 406. Thus, in order to negate the phase shift between dither excitation signal 402 and its resulting modulated response signal 406, a phase shift is added to dither excitation signal 402 by phase shifter 440. Phase shifter 440 introduces a time delay/phase shift which approximates the time it takes for dither excitation signal 402 to pass through amplifier 420, cause cavity optical length actuator 430 to implement a resulting incremental adjustment to the cavity optical path length, sensor 450 to sense this incremental cavity optical path length adjustment via an incremental change in lasing frequency, sensor 450 to output modulated response signal 406, and modulated response signal 406 to pass through amplifier 460. In one embodiment, phase shifter 440 is a simple analog filter designed to approximate these phase shifts.

Embodiments of amplifiers 420 and 460 can be any ordinary signal amplifier such as an operational amplifier. In one embodiment, amplifier 420 amplifies the amplitude of dither excitation signal 402 to a 2 volt peak-to-peak amplitude. In one embodiment, dither excitation signal 402 has a frequency of 889 Hz.

Although the foregoing wavelength-locking scheme has advantages for fine-tuning the lasing frequency, it may produce some undesirable effects. Other servos operating on the same optical link as sinusoidal dither control loop 400 may be utilizing amplitude modulation to optimize their performance. If the modulation tone frequencies of the other servos are not sufficiently separated from that used by sinusoidal dither control loop 400, an affected control loop cannot distinguish its amplitude modulation.

Figure 5:
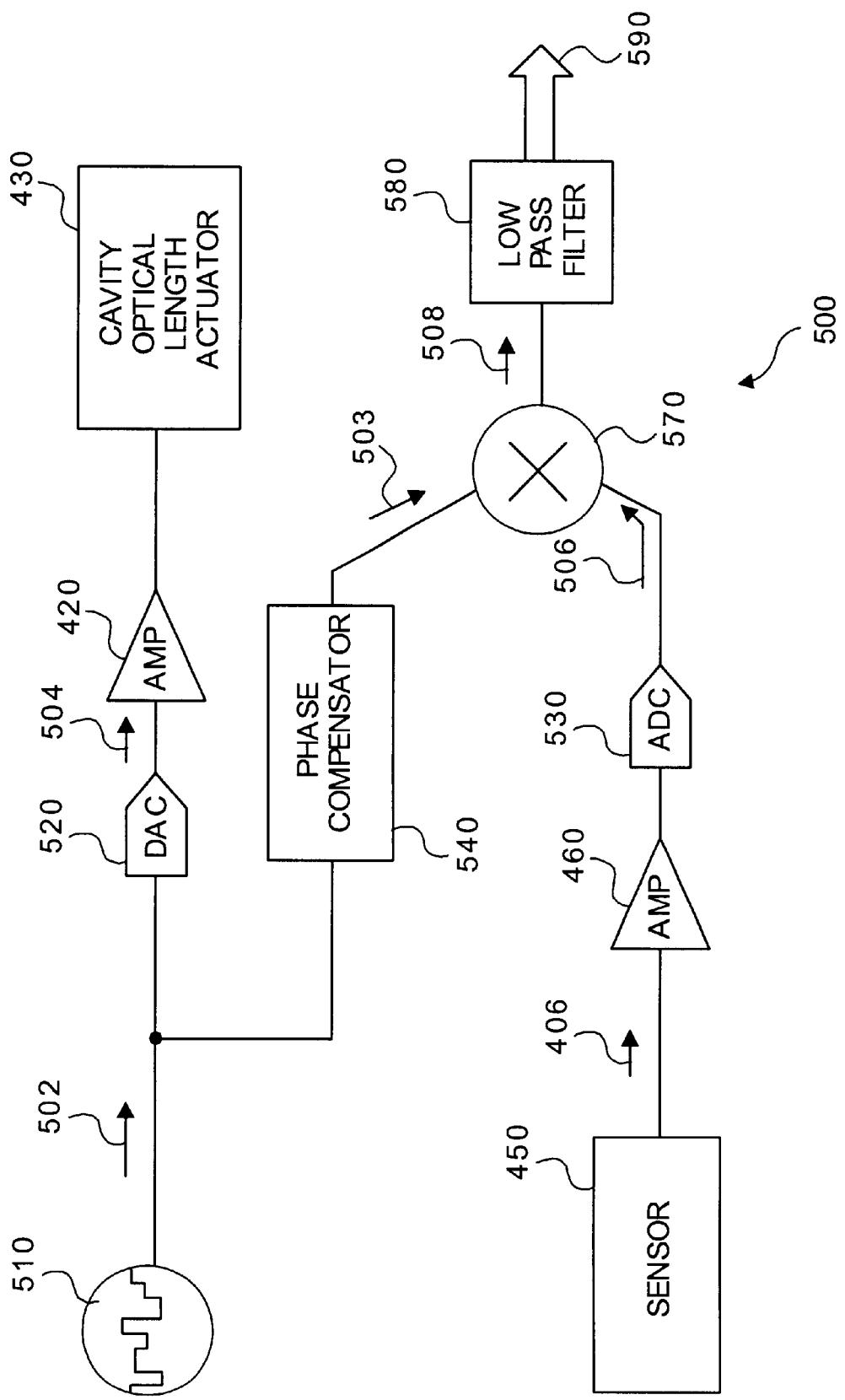
FIG. 5 illustrates an embodiment of a spread spectrum dither control loop in accordance with teachings of the present invention.

In accordance with aspects of the present invention, a spread spectrum dither control loop is employed in place of the sinusoidal dither wavelength-locking technique described above. FIG. 5 illustrates a spread spectrum dither control loop 500 for implementing the wavelength-locking technique, according to an embodiment of the present invention. In this embodiment, spread spectrum dither control loop 500 includes a random signal generator 510, amplifier 420, cavity optical length actuator 430, a phase compensator 540, sensor 450, amplifier 460, a multiplier 570, and a low pass filter 580. Spread spectrum dither control loop 500 operates in a similar manner to sinusoidal dither control loop 400, except random signal generator 510 generates random excitation signal 502 and phase compensator 540 is capable of compensating for phase delays at various random excitation signal 502 frequencies. Each of amplifier 420, cavity optical length actuator 430, sensor 450 and amplifier 460 will have a different response and corresponding phase shift at different input frequencies. Thus, phase compensator 540 is capable of adding varying phase shifts to varying frequencies of random excitation signal 502.

It should be noted, that if embodiments of spread spectrum dither control loop 500 have sufficient bandwidth, phase compensator 540 is not be necessary. In this high bandwidth embodiment, control loop elements amplifier 420, cavity optical length actuator 430, sensor 450 and amplifier 460 have sufficient bandwidth capabilities such that their composite phase shift is relatively inconsequential to wavelength locking. However, in lower bandwidth embodiments, phase compensator 540 compensates for the induced phase shifts to promote wavelength locking. In the high bandwidth embodiment, phase compensated signal 503 is equivalent to random excitation signal 502.

In one embodiment, phase compensator 540, multiplier 570 and low pass filter 580 are all digital components and generate a digital error signal 590. This digital embodiment also includes a digital-to-analog converter (DAC) 520 and an analog-to-digital converter (ADC) 530. In this digital embodiment, random signal generator 510 generates a digitized random excitation signal 502 that is converted to an analog random excitation signal 504 by DAC 520 and then amplified by amplifier 420 to drive cavity optical length actuator 430. As discussed above, modulated response signal 406 is sensed and outputted by sensor 450 and then amplified by amplifier 460. In this digital embodiment, modulated response signal 406 is converted to digitized modulated response signal 506 by ADC 530 for multiplier 570. Phase compensator 540 outputs phase compensated signal 503 to multiplier 570. Multiplier 570 takes a time-sampled dot product of phase compensated signal 503 and digitized modulated response signal 506, producing unfiltered error signal 508. Unfiltered error signal 508 is then filtered by low pass filter 580 and output as error signal 590.

In one embodiment, random excitation signal 502 is a truly random stimulus having a plurality of random frequencies over a predetermined operating frequency range. For example, random excitation signal 502 could be generated by amplifying electronic noise and filtering the result to limit the noise to a desired frequency range. In one embodiment this operating frequency range is 100 Hz to 10 KHz. In another embodiment, random excitation signal 502 is a wave train of random levels that is repeated after a fixed duration. This causes a train of frequencies. A first fundamental frequency of the train is determined by the repetition time of this pseudorandom waveform. All other frequencies are harmonics of the fundamental frequency. The fixed duration need only be long enough such that the wave train appears to be comprised of random frequencies to attached circuitry. A signal having deliberately varied frequencies is referred to as a "spread spectrum" signal. In a digital embodiment, random excitation signal 502 may have any of the above-described characteristics; however, it is a digital representation of waveforms having deliberately varied frequencies.

In one embodiment, phase compensator 540 is a digital filter that mimics the impulse responses of control loop elements: amplifier 420, cavity optical length actuator 430, sensor 450 and amplifier 460. A suitable digital filter can be implemented by characterizing spread spectrum dither control loop 500 over a range of input frequencies and determining its transfer function therefrom. One method of characterization is by stimulating DAC 520 with a single tone digitized sinusoidal frequency and measuring the time delays generated by amplifier 420, cavity optical length actuator 430, sensor 450 and amplifier 460. This measurement may then be repeated for a number of digitized sinusoidal frequencies over the operating frequency range of random signal generator 510. From these measurements a transfer function may be empirically derived. From the transfer function, a Fourier Transform can be derived. Applying an inverse Fast Fourier Transform (FFT) will produce the impulse response of the measured part of the control loop. A truncated part of this impulse response can be used to implement finite impulse response ("FIR") filter taps for one embodiment of phase compensator 540. From these characterizing equations, a filter may be designed to approximate the transfer function and thus implement phase compensator 540. In one embodiment of random signal generator 510, composite frequencies generated may range from 100 Hz or 10 kHz.

Another method to characterize the phase delay associated with the components of spread spectrum dither control loop 500 is to "hit" (i.e., stimulate) the control loop with an impulse signal at the point where random signal generator 510 generates random excitation signal 502. Since an impulse signal is theoretically composed of an infinite number of frequencies, the phase shift response associated with amplifier 420, cavity optical length actuator 430, sensor 450, and amplifier 460 can be measured. From these measurements, a suitable transfer function over the operating frequency of interest may be determined for the spread spectrum dither control loop 500 elements listed above. A suitable filter may be designed to replicate this transfer function with phase compensator 540.

In an alternative embodiment, phase compensator 540 may be implemented using a look up table comprising input frequencies correlated to phase delays. In this embodiment, phase compensator 540 would analyze the composite frequencies of random excitation signal 502. The composite frequencies of random excitation signal 502 would be separated into composite frequency ranges. Each frequency range would correspond to a phase shift in the look up table. Phase compensator 540 would apply the appropriate phase shift to the composite frequency ranges of random excitation signal 502 to generate phase compensated signal 503.

In one embodiment, phase compensated signal 503 and digitized modulated response signal 506 are combined by multiplier 570 by taking their dot product as described above in connection with Equation 2. One method is to accumulate a running summation of the product between phase compensated signal 503 (or random excitation signal 502 in a high bandwidth embodiment) and digitized modulated response signal 506 (or modulated response signal 406 in an analog embodiment) having a fixed rate of decay. Another method is to use a discrete time sampling scheme. With this method, the dot product of phase compensated signal 503 and digitized modulated response signal 506 are summed over a finite interval and then reset. Other known methods of taking the dot product between two analog or digital signals are within the scope of the present invention.

Multiplier 570 generates unfiltered error signal 508, which comprises a direct current (DC) error signal 590 and higher order alternating current (AC) harmonics. To remove the undesirable higher order AC harmonics, unfiltered error signal 508 is filtered by low pass filter 580. Embodiments of low pass filter 580 have a high frequency cutoff below the lowest frequency generated by random signal generator 510.

In one embodiment low pass filter 580 is implemented by an embodiment of multiplier 570. In this embodiment, multiplier 570 executes a running summation of its inputs, phase compensated signal 503 and digitized modulated response signal 506, with a fixed rate of decay. The summation is recursively sampled over fixed time intervals. This fixed time sampling effectively produces a digital low pass filter. In one embodiment, multiplier 570 and low pass filter 580 are a FIR filter. In another embodiment, multiplier 570 and low pass filter 580 are an infinite impulse response (IIR) filter. In yet another alternative embodiment, multiplier 570 includes a digital multiplier, but low pass filter 580 includes analog low pass filters.

In one embodiment, phase compensator 540, multiplier 570, and low pass filter 580 may be combined to generate error signal 590. Let $F(\omega)$ represent the FFT of the impulse response of amplifier 420, cavity optical length actuator 430, sensor 450 and amplifier 460 (i.e., frequency domain transfer function). $F(\omega)$ could be determined by the method described above or by any other known method. $F(\omega)$ then contains the phase compensation information. Let $S(\omega)$ represent the FFT of a most recent time segment of random excitation signal 502 and $P(\omega)$ represent the FFT of a most recent time segment of modulated response signal 506. Error signal 590 can be obtained by implementing the following equation.

$$\text{Error} = Re[(F(\omega) \times S(\omega)) \cdot \text{conj}(P(\omega))] \quad (3)$$

where $Re[\ ]$ indicates the real part of a complex number and $\text{conj}(\ )$ indicates a complex conjugate. Error signal 590 is the real part of the dot product of the combination of the phase compensator transfer function and the FFT of random excitation signal 502 with the complex conjugate of the FFT of modulated response signal 506. This calcuation uses information in the frequency domain instead of the time domain. If random signal generator 510 is a pseudorandom wave train, the time period involved in equation 3 could line up with the time period used for the FFTs. In this case, $S(\omega)$ need only be calculated once.

Embodiments of spread spectrum dither control loop 500 need not be digital. In non-digital embodiments, DAC 520 and ADC 530 are not necessary and phase compensator 540 may be implemented using analog low pass filters. Additionally, multiplier 570 and low pass filter 580 would be implemented using standard analog components. In an analog embodiment, digitized modulated response signal 506 is simply amplified replica of modulated response signal 406.

Application of random signal generator 510 to produce random excitation signal 502 means that spread spectrum dither control loop 500 need not negotiate a unique frequency tone; rather, frequencies are spread over the entire operating spectrum. This spread spectrum approach prevents interference arising from other control loops in attached circuitry. If a unique tone is used, as in sinusoidal dither control loop 400 for dither excitation signal 402, other control loops using a similar frequency or harmonic thereof may cause interference. Instead, by having either, or preferably both, control loops using a spread spectrum dither, interference will appear as inconsequential low-level noise.

Figure 6:
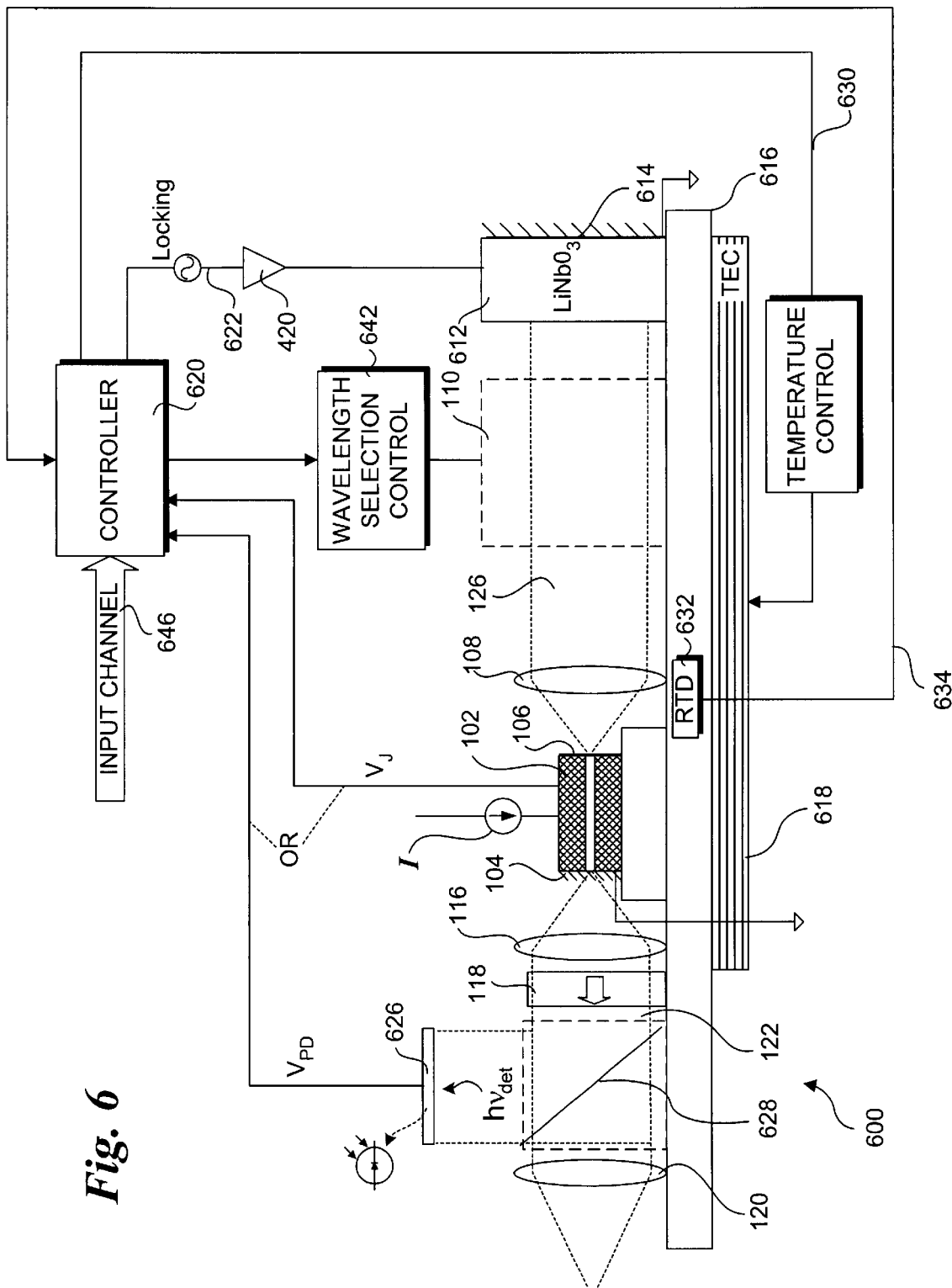
FIG. 6 illustrates an embodiment of an ECDL for use with embodiments of the dither technique for locking to a transmission peak in accordance with teachings of the present invention.
Figure 7:
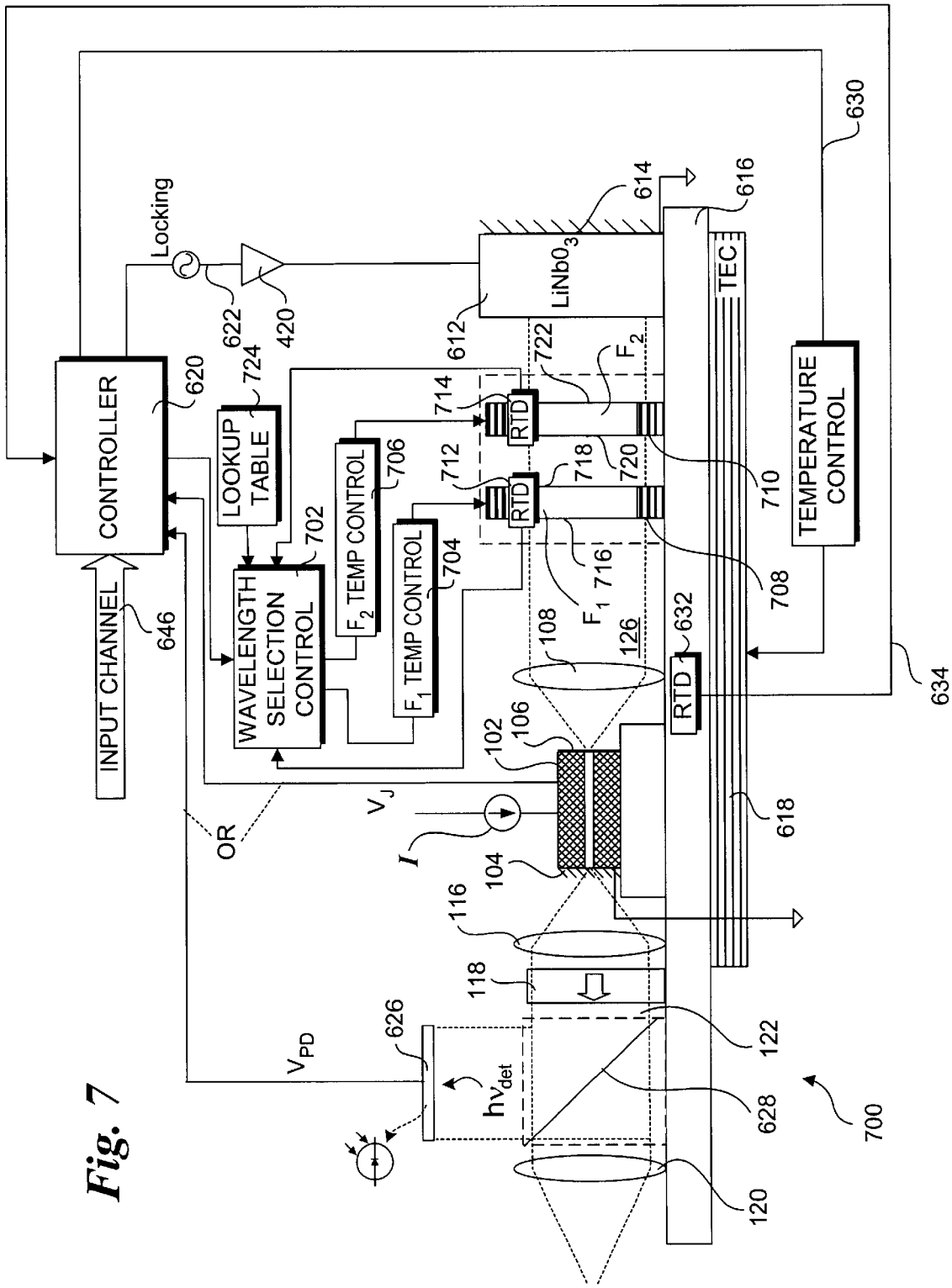
FIG. 7 illustrates an embodiment of an ECDL for use with embodiments of the dither technique for locking to a transmission peak using a LiNbO$_3$ cavity length actuator in accordance with the teachings of the present invention.

FIG. 6 illustrates an ECDL 600 according to an embodiment of the present invention. This embodiment of ECDL 600 has various elements common to ECDL 100 where like reference numbers, such as a gain diode chip 102, lenses 108, 116, and 120, etc., refer to like elements. ECDL 600 further includes a cavity optical length modulating element 612 (e.g., cavity optical length actuator 430) having a reflective rear face 614. In one embodiment, cavity optical length modulating element 612 comprises a Lithium Niobate ($LiNbO_3$) phase modulator to which a back-side mirror is coupled. Lithium Niobate is a material that changes its index of refraction (ratio of the speed of light through the material divided by the speed of light through a vacuum) when a voltage is applied across it. As a result, by providing an excitation voltage (e.g., random excitation signal 502) across the $LiNbO_3$ phase modulator, the cavity optical path length of ECDL 600 can be caused to modulate, thereby producing modulated response signal 406 discussed above.

The various optical components of the ECDL 600 are mounted or otherwise coupled to a thermally-controllable base or "sled" 616. In one embodiment, one or more thermal-electric cooler (TEC) elements 618, such as a Peltier element, are mounted on or integrated in sled 616 such that the temperature of sled 616 can be precisely controlled via an input electrical signal. Due to the expansion and contraction of a material in response to a temperature change, the length of the sled can be adjusted very finely. Adjustment of the length results in a change in the distance between partially reflective front facet 104 and reflective element 614, which produces a change in the cavity optical path length. As a result, controlling the temperature of sled 616 can be used to adjust the frequency of the lasing mode. In general, temperature control of sled 616 will be used for very fine tuning adjustments, while coarser tuning adjustments will be made by way of tuning filter elements 110, as described in further detail below.

For simplicity, let us first consider the operation of the wavelength-locking feature alone. A controller 620 is responsible for much of the functionality for implementing the wavelength-locking feature. Embodiments of controller 620 contain many of the elements of spread spectrum dither control loop 500. Controller 620 generates a modulated wavelength-locking signal 622 (e.g., dither excitation signal 402 or random excitation signal 502), which is amplified by amplifier 420. The amplified modulated wavelength-locking signal 622 is then supplied to a surface of the $LiNbO_3$ phase modulator, while an opposite surface is connected to ground, thereby providing a voltage differential across the $LiNbO_3$ material. As a result, the optical path length of the modulator, and thus the cavity optical path length of ECDL 600, is modulated at the frequency of modulated wavelength-locking signal 622.

This optical path length modulation produces a modulation in the intensity of output optical beam 122, which in one embodiment is detected by a photodetector 626. As depicted in FIG. 6, a beam splitter 628 is disposed in the path of output optical beam 122, causing a portion of output optical beam 122 to be directed toward photodetector 626. In one embodiment, photodetector 626 comprises a photo diode, which generates a voltage charge in response to the light intensity it receives ($h\nu_{det}$). A corresponding voltage $V_{PD}$ is then fed back to controller 620.

In one embodiment, controller 620 includes a digital servo loop (e.g., phase lock loop) that is configured to adjust the temperature of sled 616. This temperature adjustment minimizes the amplitude of the intensity perturbation detected by photodectector 626 in accordance with the wavelength-locking scheme discussed above with reference to FIGS. 2 and 3. In an optional embodiment, the junction voltage ($V_J$) across diode gain chip 102 is employed as the intensity feedback signal, rather than $V_{PD}$.

An error signal (e.g., error signal 490 or 590) is then derived based on the amplitude of the intensity perturbation and phase of $V_{PD}$ or $V_J$ in combination with modulated wavelength-locking signal 622. In one embodiment, this error signal is provided to a proportional, integral, and derivative (PID) controller via control signal 630 to adjust the heating and/or cooling of TEC 618, which in turn adjusts the temperature of sled 616. Adjustment of the temperature of sled 616 causes a corresponding change in the overall cavity optical path length, and thus the lasing frequency. This in turn results in (ideally) a decrease in the difference between the lasing frequency and channel frequency centerline 200, thus completing the control loop. To reach an initial condition, or for a second feedback signal, a resistive thermal device (RTD) 632, such as a thermister or thermocouple, may be used to provide a temperature feedback signal 634 to controller 620.

In addition to wavelength locking, embodiments of ECDL 600 also provide channel-tuning features. As illustrated, controller 620, in combination with a wavelength selection control block 642 and tuning filter elements 110, is used to switch the lasing frequency to correspond to a desired communication channel. For example, in response to an input channel command 646, controller 420 sends a corresponding frequency command signal to wavelength selection control block 642, which then provides a control input to tuning filter elements 110 to cause the lasing mode to be switched proximate to the desired input channel frequency. A continuous fine tuning adjustment is then made by embodiments of sinusoidal dither control loop 400 or spread spectrum dither control loop 500.

In general, various tuning filter elements and corresponding tuning adjustment techniques may be employed for channel selection purposes. For example, in one embodiment of ECDL 700 shown in FIG. 5, tuning filter elements 110 comprise first and second tunable filters $F_1$ and $F_2$. In one embodiment, filters $F_1$ and $F_2$ comprise respective etalons, either made of a solid material or being gas filled. In one embodiment, filter tuning is effectuated by changing the optical path length of each etalon. This in turn may be induced by changing the temperature of the etalons.

For example, ECDL 700 shows further details of one embodiment of a channel selection subsystem including a wavelength selection control block 702. It is noted that although the wavelength selection control block is shown external to controller 620, the control aspects of this block may be provided by controller 620 alone. Wavelength selection control block 702 provides electrical outputs 704 and 706 for controlling the temperatures of filters $F_1$ and $F_2$, respectively. In one embodiment, a temperature control element is disposed around the perimeter of a circular etalon, as depicted by TECs 708 and 710. Respective RTDs 712 and 714 are employed to provided a temperature feedback system back to wavelength selection control block 702.

Generally, etalons are employed in laser cavities to provide filtering functions. They function as Fabry-Perot resonators. The result of passing an optical beam through an etalon produces a set of transmission peaks (also called pass bands) in a laser output. The spacing of the transmission peaks (in frequency, also known as the free spectral range) is dependent on the distance between the two faces of the etalon, e.g., faces 516 and 518 for filter $F_1$, and faces 520 and 522 for filter $F_2$. As the temperatures of the etalons change, the etalon material is caused to expand or contract, thus causing the distance between the faces to change. This effectively changes the optical path length of the etalons, which may be employed to shift the transmission peaks.

The effect of filters $F_1$ and $F_2$ is cumulative. As a result, all lasing modes except for a selected channel lasing mode can be substantially attenuated by lining up a single transmission peak of each filter. In one embodiment, the configurations of the two etalons are selected such that the respective fee spectral ranges of the etalons are slightly different. This enables transmission peaks to be aligned under a vernier tuning technique similar to that employed by a vernier scale. In one embodiment, one of the filters, known as a "grid generator," is configured to have a free spectral range corresponding to a communications channel grid, such as the International Telecommunication Union (ITU) wavelength grid. This wavelength grid remains substantially fixed by maintaining the temperature of the corresponding grid generator etalon at a predetermined temperature. At the same time, the temperature of the other etalon, known as the channel selector, is adjusted so as to shift its transmission peaks relative to the those of the grid generator. By shifting the transmission peaks of the filters in this manner, transmission peaks corresponding to channel frequencies may be aligned, thereby producing a lasing mode corresponding to the selected channel frequency. In another embodiment, the transmission peaks of both the filters are shifted to select a channel.

Generally, either of these schemes may be implemented by using a channel-etalon filter temperature lookup table in which etalon temperatures for corresponding channels are stored, as depicted by lookup table 724. Typically, the etalon temperature/channel values in the lookup table may typically be obtained through a calibration procedure, through statistical data, or calculated based on tuning functions fit to the tuning data. In response to an input channel selection 646, the corresponding etalon temperatures are retrieved from lookup table 724 and employed as target temperatures for the etalons using appropriate temperature control loops, which are well known in the art.

In accordance with another aspect of the invention, embodiments are provided for modulating the cavity optical path length by modulating the distance between the cavity's reflective extremities, i.e., modulating the physical length of the cavity. In this instance, the physical cavity length modulation produces a corresponding cavity optical path length modulation, resulting in an intensity modulation in the laser output in a manner similar to the Lithium Niobate embodiment discussed above.

Figure 8:
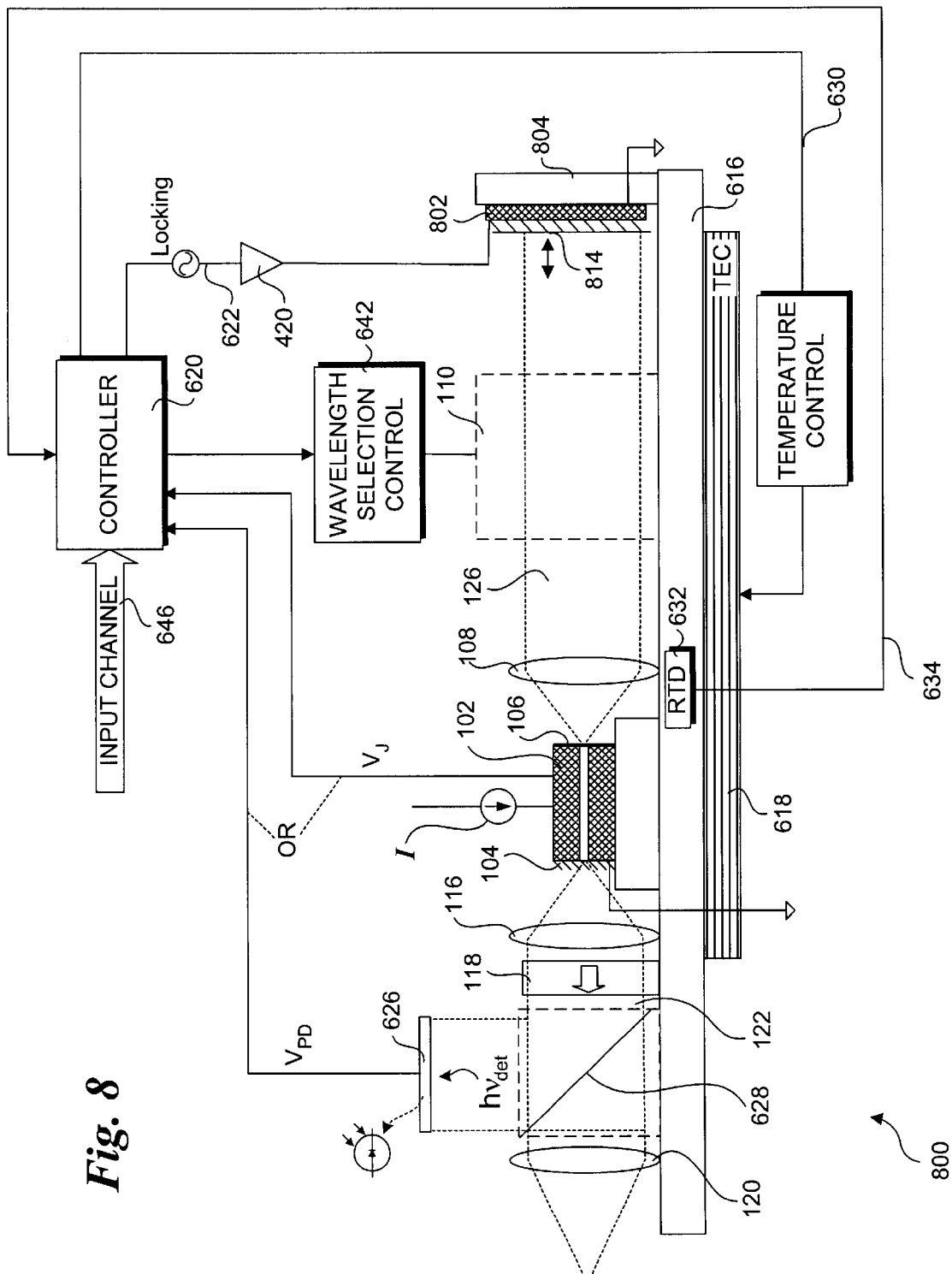
FIG. 8 illustrates an embodiment of an ECDL for use with embodiments of the dither technique for locking to a transmission peak using a piezoelectric cavity length actuator in accordance with the teachings of the present invention.

An ECDL 800 illustrative of a first embodiment for modulating the physical length of the cavity is shown in FIG. 8. This embodiment employs a piezoelectric element 802, having a backside face mounted to an upright member 604, which in turn is coupled to base 616. A reflective element (e.g. mirror) 614 is mounted to or formed on the front side face of piezoelectric element 802. For example, reflective element 814 may include a reflective coating applied to the front side face of piezoelectric element 802.

In response to a voltage differential across its faces, piezoelectric element 802 is caused to expand and contract. If the amplitude of the voltage is modulated, the expansion and contraction of the piezoelectric element will be modulated as well, effectively modulating the thickness of the element. Since reflective element 814 is mounted to or formed on the front side face of piezoelectric element 802, the physical cavity length is caused to modulate in response to the piezoelectric element 802 modulation, including an intensity modulation in ECDL 800's output optical beam 122, as desired.

In a manner similar to that discussed above, modulated wavelength-locking signal 622 is generated by controller 620. This signal is then amplified by amplifier 420 to drive the modulation of piezoelectric element 802.

Figure 9:
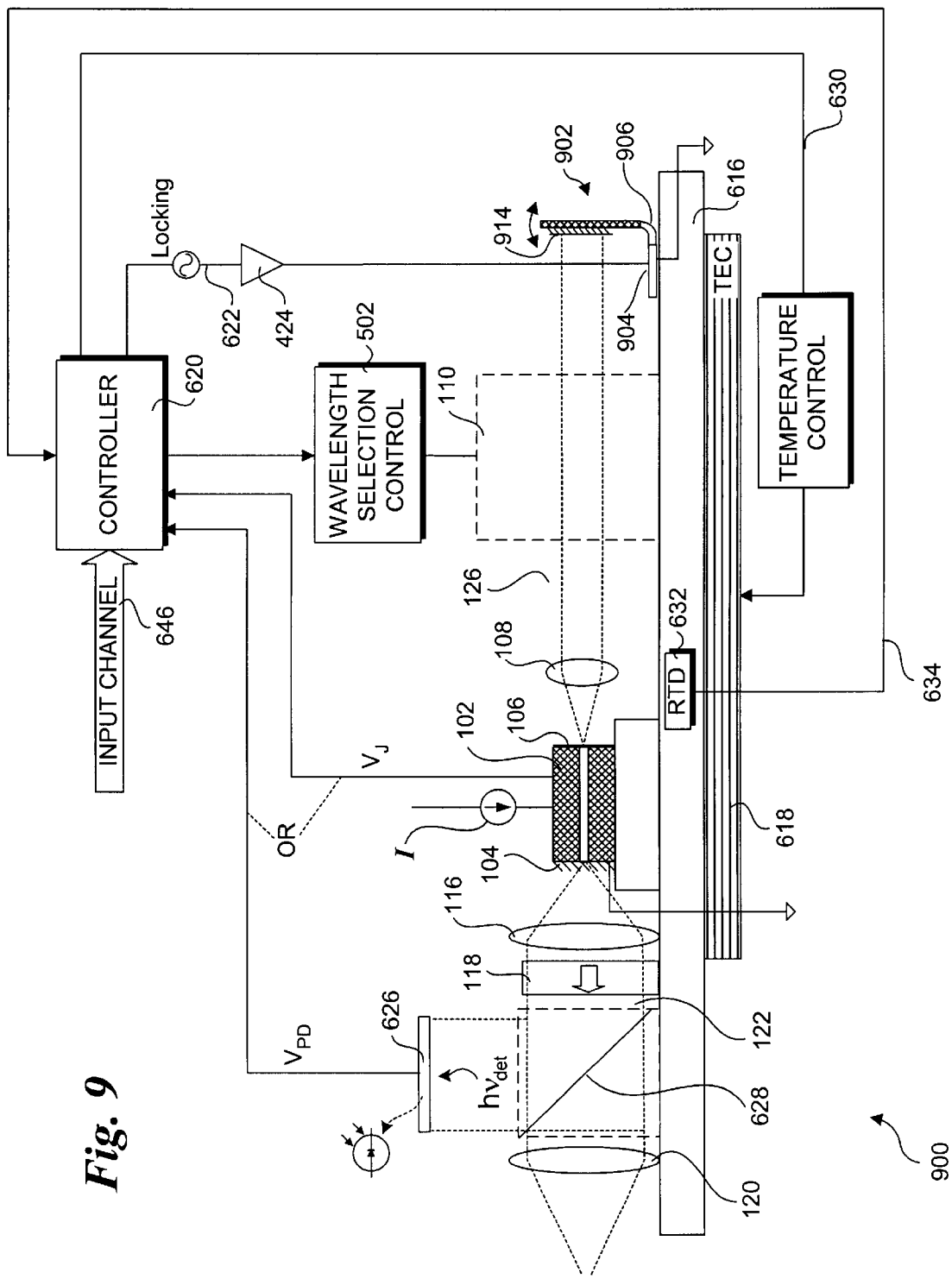
FIG. 9 illustrates an embodiment of an ECDL for use with embodiments of the dither technique for locking to a transmission peak using a microelectro-mechanical system (MEMS) cavity length actuator in accordance with the teachings of the present invention.

An ECDL 900 illustrating a second embodiment for modulating the physical cavity path length is shown in FIG. 9. In this embodiment a MEMS (microelectro-mechanical systems) device 902 is employed. In the illustrated embodiment, MEMS device 902 comprises a MEMS hinge including an actuator 904 coupled to a cantilevered plate 906. A portion of the front side face of the cantilevered plate is coated with a reflective surface 914. In one embodiment, actuator 904 comprises a pair of "comb" arrays, wherein the fixed fingers of one of the comb arrays are coupled to base 616, while the free fingers of the other comb array are coupled to cantilevered plate 906. In response to an electrical input, an electrostatic force is generated, causing the free comb fingers to move relative to the fixed fingers. As a result, the hinge is rotated, thereby shortening and lengthening the physical laser cavity length. Generally, the amount of rotation is very small, producing a length modulation in one embodiment of approximately 1 or 2 nm.

MEMS comb array actuators of the foregoing type are known in the MEMS arts. In addition to hinge-type actuators, parallel displacement actuators may be used as well, such as an electrostatically actuated parallel plate configuration employing quadrilateral flexures. When a parallel displacement actuator is employed, it will be mounted to an upright member and employed in a manner similar to piezoelectric element 802. Again, the drive signal for MEMS actuator 902 is modulated wavelength-locking signal 622 (e.g., dither excitation signal 402 or random excitation signal 502).

In one embodiment, the various ECDL configurations described herein may be manufactured using a hybrid process, combining semiconductor-type processing techniques for forming applicable elements on a substrate, and then attaching other components to the substrate during subsequent operations. For example, in one embodiment, base 416 comprises an aluminum nitride substrate.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. A laser apparatus, comprising:
    a gain medium pumped to emit a plurality of photons in response to an electrical input;
    a laser cavity, optically coupled to the gain medium, in which said plurality of photons resonate in accordance with a plurality of lasing modes;
    a signal generator, to generate an excitation signal having varying frequencies;
    a cavity optical length actuator to vary a cavity optical path length of the laser and responsive to the excitation signal to induce corresponding intensity perturbations in an optical beam produced by the laser;
    a sensor operatively coupled to sense the intensity perturbations in the optical beam and to generate a response signal corresponding to the intensity perturbations;
    a phase compensator to add a frequency dependent phase shift to the excitation signal to create a phase-shifted excitation signal that is synchronized with the response signal; and
    a combiner coupled to combine the phase-shifted excitation signal and the response signal to generate an error signal.

2. The apparatus of claim 1 wherein the combiner comprises a multiplier.

3. The apparatus of claim 2 wherein the multiplier generates the error signal comprising a running summation of a product of the excitation signal and the response signal with a fixed rate of decay.

4. The apparatus of claim 1 wherein the phase compensator mimics a transfer function of the laser with a digital filter.

5. The apparatus of claim 1 wherein the phase compensator mimics a transfer function of the laser using a look up table relating phase shifts to corresponding excitation signal frequencies.

6. The apparatus of claim 1 wherein the excitation signal comprises a spread spectrum signal.

7. The apparatus of claim 6 wherein the spread spectrum signal comprises a random plurality of frequencies.

8. The apparatus of claim 6 wherein the spread spectrum signal comprises a digitized signal.

9. The apparatus of claim 6 wherein the spread spectrum signal consists substantially of frequencies between 100 Hz and 10 KHz.

10. The apparatus of claim 1, further comprising a controller coupled to receive the error signal and to adjust a center lasing wavelength of the laser responsive to the error signal.

11. The apparatus of claim 1, further comprising a filter to suppress alternating current content in the error signal having a frequency equal to or greater than the excitation signal.

12. The apparatus of claim 11 wherein the filter is effectuated by discrete time sampling of the excitation signal and the response signal by the multiplier.

13. The apparatus of claim 1 wherein the sensor comprises a photodiode positioned to receive a portion of the optical beam.

14. The apparatus of claim 1 wherein the sensor senses a voltage across a junction of a diode of the laser, the voltage being indicative of the intensity perturbations.

15. A method for tuning a laser, comprising:
    modulating a center lasing wavelength of an optical beam produced by the laser at a varying rate to induce an intensity perturbation in the optical beam in response to an excitation signal;
    sensing the intensity perturbation;
    combining the sensed intensity perturbation with the excitation signal to derive an error signal comprising a substantially direct current signal having an amplitude being indicative of a misalignment between the center lasing wavelength of the optical beam and a desired center lasing wavelength; and adjusting the center lasing wavelength of the optical beam responsive to the error signal.

16. The method of claim 15, further comprising:

generating an excitation signal having varying frequencies driving an optical path length adjustment element with the excitation signal to induce a modulation of the center lasing wavelength; and generating a response signal corresponding to the sensed intensity perturbation.

17. The method of claim 16 wherein deriving an error signal comprises combining the response signal with the excitation signal.

18. The method of claim 17 wherein the excitation signal comprises a spread spectrum signal.

19. The method of claim 18 wherein the spread spectrum signal comprises random frequencies.

20. The method of claim 18 wherein the spread spectrum signal comprises a digitized signal.

21. The method of claim 18 wherein the error signal comprises a real part of a dot product between the product of a first fast Fourier transform (FFT) of the laser and a second FFT of the excitation signal with a complex conjugate of a third FFT of the response signal, the error signal being calculated in a frequency domain.

22. The method of claim 17, further comprising adding a first frequency dependant phase shift to the excitation signal prior to combining the excitation signal with the response signal to compensate for a second frequency dependant phase shift between the excitation signal and the response signal.

23. The method of claim 22 wherein adding the first frequency dependent phase shift comprises mimicking a transfer function of the laser with a digital filter.

24. The method of claim 15 wherein adjusting the center lasing wavelength comprises minimizing the intensity perturbations by aligning the center lasing wavelength with a peak of a power output curve of the laser.

25. A laser, comprising:

means for generating an optical beam of the laser;

means for generating an excitation signal having varying frequencies;

means for varying a cavity optical path length of the laser responsive to the excitation signal to induce corresponding intensity perturbations in the optical beam;

means for sensing the intensity perturbations in the optical beam and generating a response signal corresponding to the intensity perturbations;

means for combining the excitation signal and the response signal to generate an error signal, the error signal comprising a substantially direct current signal having an amplitude being indicative of a misalignment between a center lasing wavelength of the laser and a desired center lasing wavelength.

26. The laser of claim 25, further comprising means for adding a first frequency dependent phase shift to the excitation signal prior to the combining means, the first frequency dependent phase shift to compensate for a second frequency dependent phase shift between the excitation signal and the response signal received by combining means.

27. The laser of claim 25, further comprising a filter means to suppress alternating current content in the error signal having a frequency equal to or greater than the excitation signal.

28. A communication system, comprising:

a tunable laser to generate an optical beam, the tunable laser comprising:

a cavity optical length actuator to vary a cavity optical path length of the tunable laser responsive to an excitation signal having varying frequencies to induce corresponding intensity perturbations in the optical beam;

a sensor operatively coupled to sense the intensity perturbation in the optical beam and to generate a response signal corresponding to the intensity perturbations; and a combiner coupled to combine the excitation signal and the response signal to generate an error signal, the error signal being indicative of a misalignment between a center lasing wavelength of the tunable laser and a desired center lasing wavelength; and an optic fiber coupled to receive the optical beam from the tunable laser and to transmit the optical beam over a fiber based network.

29. The communication system of claim 28 wherein the tunable laser further comprise a controller coupled to receive the error signal and to adjust the center lasing wavelength of the tunable laser responsive to the error signal.

30. The communication system of claim 29 wherein the tunable laser further comprises a signal generator to generate the excitation signal.

31. The communication system of claim 29 wherein the tunable laser further comprise a phase compensator coupled to receive the excitation signal before the combiner and to add a first frequency dependent phase shift to the excitation signal to compensate for a second frequency dependent phase shift between the excitation signal and the response signal at a point where the response signal is received by the combiner.

32. The communication system of claim 29 wherein the tunable laser further comprise a filter coupled to receive the error signal prior to the controller and to suppress alternating current content in the error signal having a frequency equal to or greater than the excitation signal.

* * * * *

UNITED STATES PATENT AND TRADEMARK OFFICE
CERTIFICATE OF CORRECTION

PATENT NO. : 6,687,269 B1  Page 1 of 1
DATED : February 3, 2004
INVENTOR(S) : Rice et al.

It is certified that error appears in the above-identified patent and that said Letters Patent is hereby corrected as shown below:

Column 5,
Line 50, delete "X", insert -- ω --.

Signed and Sealed this

Eighteenth Day of May, 2004

JON W. DUDAS
*Acting Director of the United States Patent and Trademark Office*